(12) United States Patent
Minnick et al.

(10) Patent No.: US 6,260,894 B1
(45) Date of Patent: Jul. 17, 2001

(54) ASSEMBLY FOR WAFER HANDLING SYSTEM

(75) Inventors: Andrew Minnick, Essex Junction; James Wilson, Willison, both of VT (US); Abhilash J. Mayur, Salinas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/322,285

(22) Filed: May 28, 1999

(51) Int. Cl.$^7$ ................................................. B65G 49/07
(52) U.S. Cl. ............................................ 294/1.1; 414/941
(58) Field of Search ............................ 294/1.1, 32, 902; 414/225.01, 935, 936, 939, 941; 901/28, 29

(56) References Cited

U.S. PATENT DOCUMENTS

| | | | |
|---|---|---|---|
| 5,622,400 | * 4/1997 | George | 414/941 |
| 5,669,644 | * 9/1997 | Kaihotsu et al. | 414/941 |
| 5,700,046 | * 12/1997 | Van Doren et al. | 414/941 |
| 5,711,646 | * 1/1998 | Ueda et al. | 414/941 |
| 5,746,460 | * 5/1998 | Marohl et al. | 414/941 |
| 5,789,878 | * 8/1998 | Kroeker et al. | 414/935 |
| 5,980,194 | * 11/1999 | Freerks et al. | 414/939 |

* cited by examiner

*Primary Examiner*—Dean J. Kramer
(74) *Attorney, Agent, or Firm*—Pennie & Edmonds LLP

(57) ABSTRACT

A blade assembly for a mechanical wafer handling system. The assembly includes an elongated planar member having a central region, wherein the central region has a first array of openings and a second array of openings, the openings of the first array being arranged substantially symmetrically to the openings of the second array on opposing sides of a central longitudinal axis extending along the length of the planar member and passing through a center point of the central region. The openings in the first array are arranged substantially symmetrically with respect to a perpendicular axis extending along the width of the elongated planar member and passing through a center point of the central region. The openings in the second array are also arranged substantially symmetrically with respect to the perpendicular axis. The assembly also includes a wrist with a wrist upper cap and a wrist lower cap. The wrist upper cap has a first and a second wing support on two opposing sides of the upper cap and a first non-supporting narrow ridge extending between the first and second wing supports. The wrist lower cap has a third and a fourth wing support on two opposing sides of the lower cap with a second non-supporting narrow ridge extending between the third and the fourth wing supports. The wrist upper cap is attached to a top surface of the planar member and the wrist lower cap is attached to a bottom surface of the planar member when the blade assembly is assembled.

20 Claims, 11 Drawing Sheets

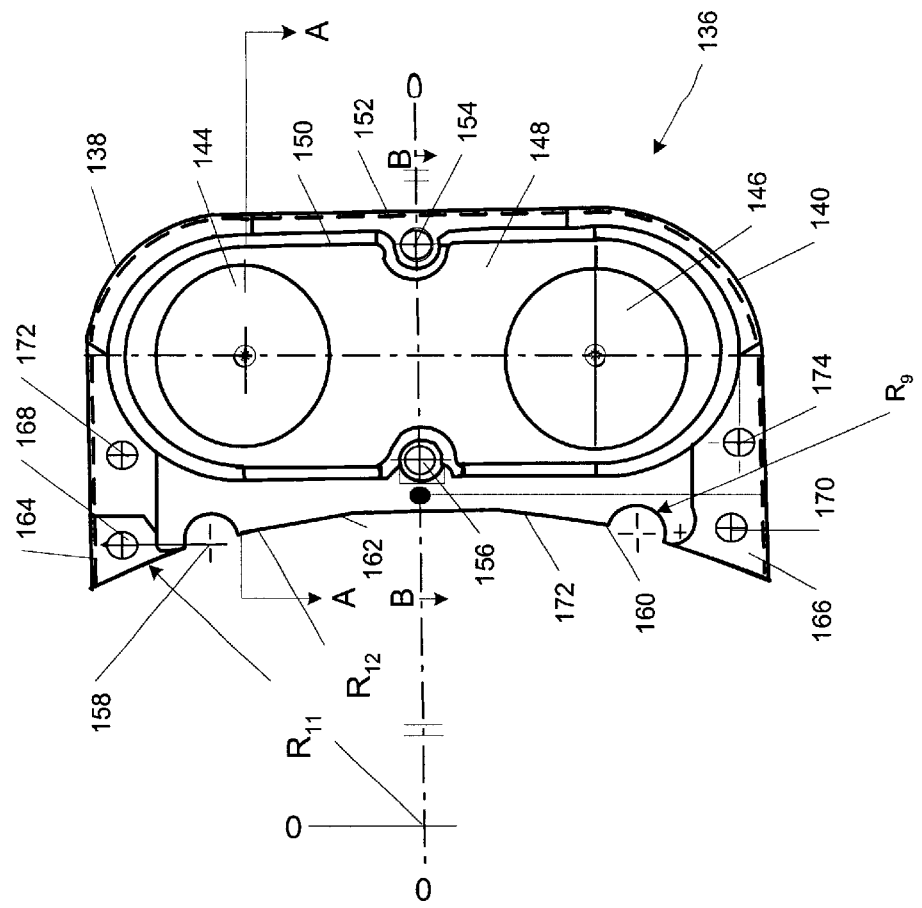
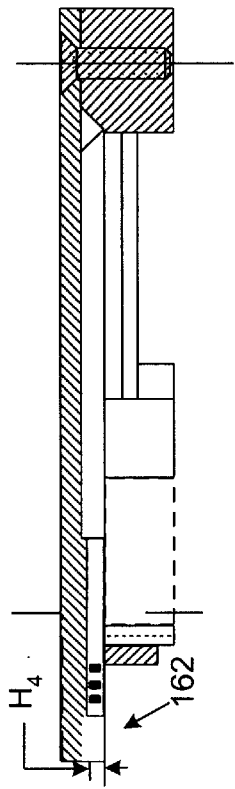
FIG. 9
FIG. 9A
SECTION B-B

2x SECTION A-A

ASSEMBLY FOR WAFER HANDLING SYSTEM

BACKGROUND OF THE INVENTION

This invention relates to mechanical wafer handling systems for semiconductor processing equipment.

Mechanical wafer handling systems transport wafers from wafer carriers to processing chambers and vice versa. Various fabrication processes are carried out in processing chambers, including annealing, oxidation, nitridation, etching, and deposition. The wafer handling system might include a robot, an arm operated by the robot, and an implement at the end of the arm to hold the wafer.

Before processing, a wafer may be at room temperature, while in a wafer carrier. During processing, the temperature of a wafer may rise to 1200° C. or higher. Thus, a wafer may be extracted from the chamber while still hot, e.g. 550° C. to 750° C. or higher. Thus, the implement for holding the wafer needs to handle wafers of various temperatures, including hot wafers.

SUMMARY OF THE INVENTION

In general, in one aspect, the invention features a blade for a mechanical wafer handling system. An elongated planar member has a central region. A first array of openings and a second array of openings are provided within the central region. The openings of the first array are arranged substantially symmetrically to the openings of the second array on opposing sides of a central longitudinal axis extending along the length of the planar member and passing through a center point of the central region. The openings in the first array are arranged substantially symmetrically with respect to a perpendicular axis extending along the width of the elongated planar member and passing through a center point of the central region. The openings in the second array are also arranged substantially symmetrically with respect to the perpendicular axis.

Embodiments may include one or more of the following. The first array of openings and the second array of openings comprise two circular openings and two oval openings. One short end of the elongated planar member has a notch. The planar member has a peripheral opening positioned between the openings of the first and second arrays of openings and a second short end of the elongated planar member. Opposing short ends of the elongated planar member have ledges to support a wafer. The elongated planar member is made out of quartz.

In another aspect, the invention features a blade assembly for a mechanical wafer handling system. The assembly includes an elongated planar member with a central region. The central region has a first array of openings and a second array of openings. The openings of the first array are arranged substantially symmetrically to the openings of the second array on opposing sides of a central longitudinal axis extending along the length of the planar member and passing through a center point of the central region. The openings in the first array are arranged substantially symmetrically with respect to a perpendicular axis extending along the width of the elongated planar member and passing through a center point of the central region. The openings in the second array are also arranged substantially symmetrically with respect to the perpendicular axis. The assembly also includes a wrist upper cap having a first and a second wing support on two opposing sides of the upper cap and a first non-supporting narrow ridge extending between the first and second wing supports. Further, the assembly includes a wrist lower cap having a third and a fourth wing support on two opposing sides of the lower cap with a second non-supporting narrow ridge extending between the third and the fourth wing supports. The wrist upper cap is attached to a top surface of the planar member and the wrist lower cap is attached to a bottom surface of the planar member when the blade assembly is assembled.

Embodiments may also include one or more of the following. The elongated planar member and the first, second, third, and fourth wing supports have screw holes. The screw holes are arranged so that the screw holes in the planar member are aligned with the screw holes in the first, second, third, and fourth wing supports when the blade assembly is assembled. The first ridge and the second ridge are each less than ⅛ thick. The upper and the lower wrist caps are each made out of stainless steel. The upper and lower caps are each coated with anodized nickel.

An advantage of the blade is that its arrays of openings significantly reduce the thermal gradients which occur across the hot wafer when it is picked up by the blade. Further, the construction of the wrist assembly substantially reduces its points of contact with the blade, thereby reducing the heat sink effect of the wrist assembly. Finally, the ridges of the transition between the wrist assembly and the blade act as a barrier which prevents particles from reaching the wafer while it rests on the blade.

Further aspects, features, and advantages will be found in the following.

BRIEF DESCRIPTION OF THE DRAWINGS

FIG. 9 is a top view of a wrist lower cap;

FIG. 9A and FIG. 10 are cross-sectional views of the wrist lower cap of FIG. 9.

DESCRIPTION OF THE PREFERRED EMBODIMENTS

Figure 1:
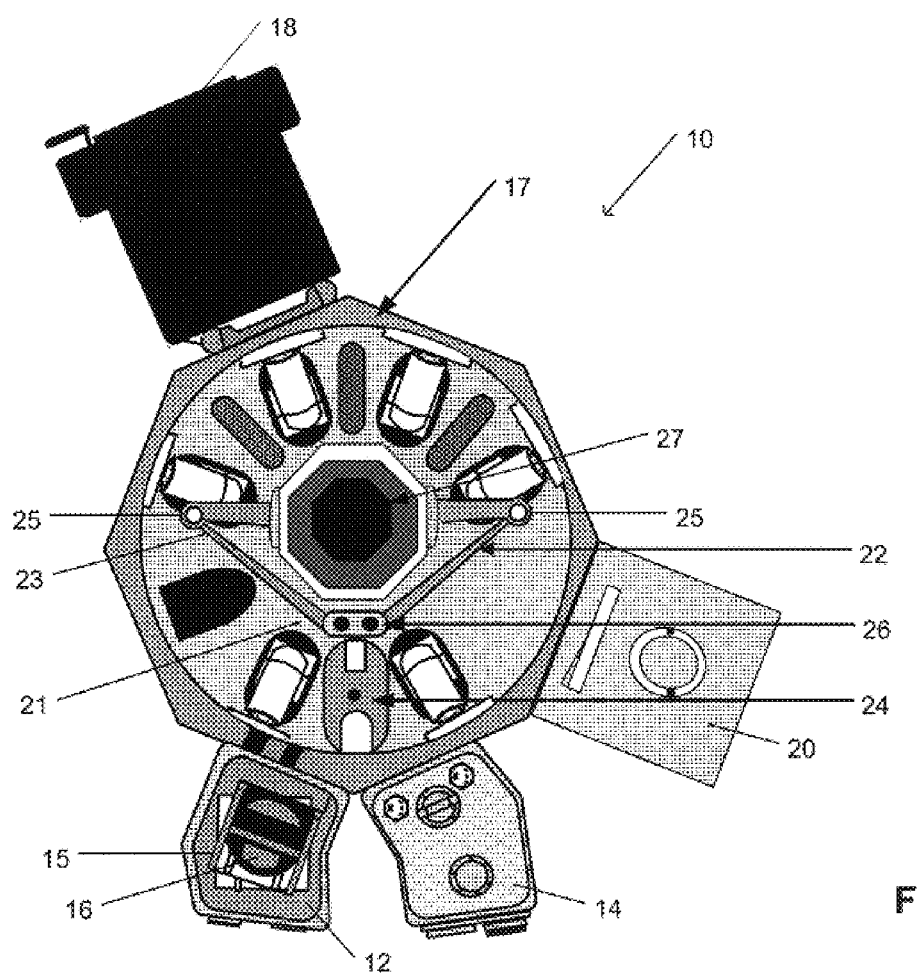
FIG. 1 is a schematic view of a mechanical wafer handling system.

FIG. 1 shows a cluster tool 10 which is typical of the type of system that utilizes a wafer handling robot system described herein.

The cluster tool 10 has loadlock chambers 12 and 14. These chambers 12 and 14 hold wafer cassette(s) 15 in which wafers 16 are stored before and after processing. Loadlock chambers 12 and 14 are kept under vacuum while holding wafer cassette(s) 15 and constitute the only part of cluster tool 10 which is opened to the environment during normal operation. Cluster tool 10 also has a central transfer chamber 17 through which a wafer 16 travels when it is transferred between various stations. The wafer 16 is processed in a process chamber 18, in which it may undergo any one of a several possible processes, such as oxidation, nitridation, anneal, deposition, or etch. After processing, the wafer is transferred to a cooldown chamber 20 before being returned to loadlock chamber 12 or 14. If the wafer is hot after processing, in order to avoid contamination of the wafer and damage of cassette 15, the wafer needs to be cooled before it can be placed in cassette 15. For this reason, the wafer is cooled in cooldown chamber 20 after processing. A commercially available example of a cluster tool is the Applied Materials Centura platform (Applied Materials, 2881 Scott Boulevard, Santa Clara, Calif. 95050).

Figure 2:
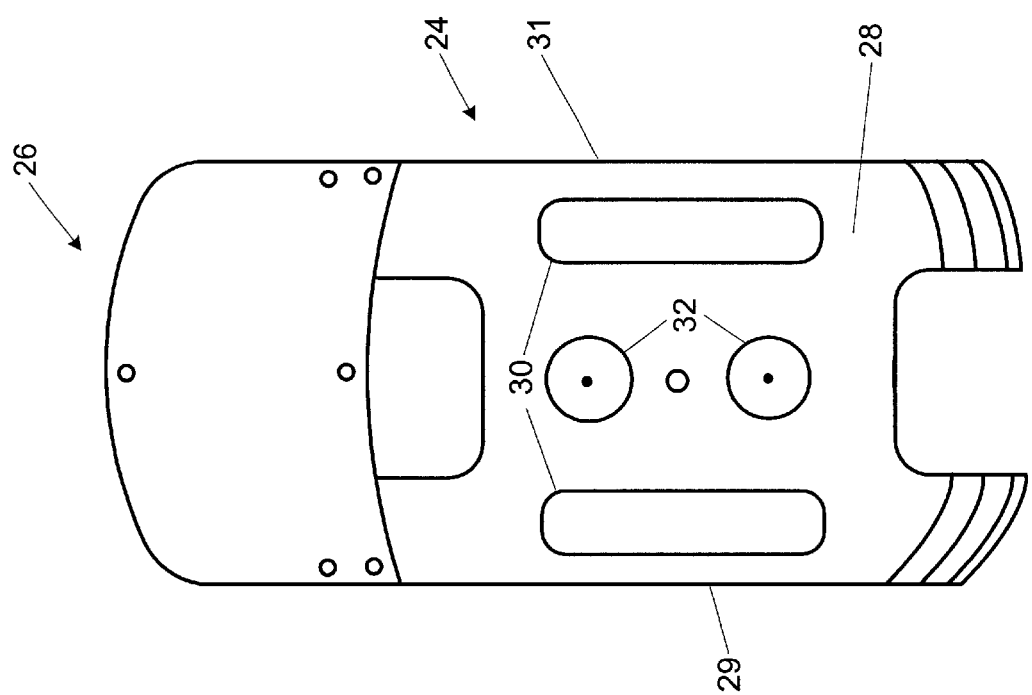
FIG. 2 is a top view of blade being held by a wrist assembly.

A robot system 21 transfers a wafer 16 both in and out of as well as between chambers 12, 14, 17, 18, and 20. Referring to FIGS. 1 and 2, robot system 21 includes two robot arms 22 and 23 and a blade 24. Robot arms 22 and 23 each have elbow joints 25 and are pivoted on a central hub 27 to which they are attached at one end. Blade 24 is connected to the other ends of robot arms 22 and 23 by a wrist 26. During wafer transfer, blade 24 supports the wafer 16. The wafer 16 may be cold, e.g. coming out of loadlock chamber 12, or it may be hot, e.g. after being processed in process chamber 18.

Figure 3:
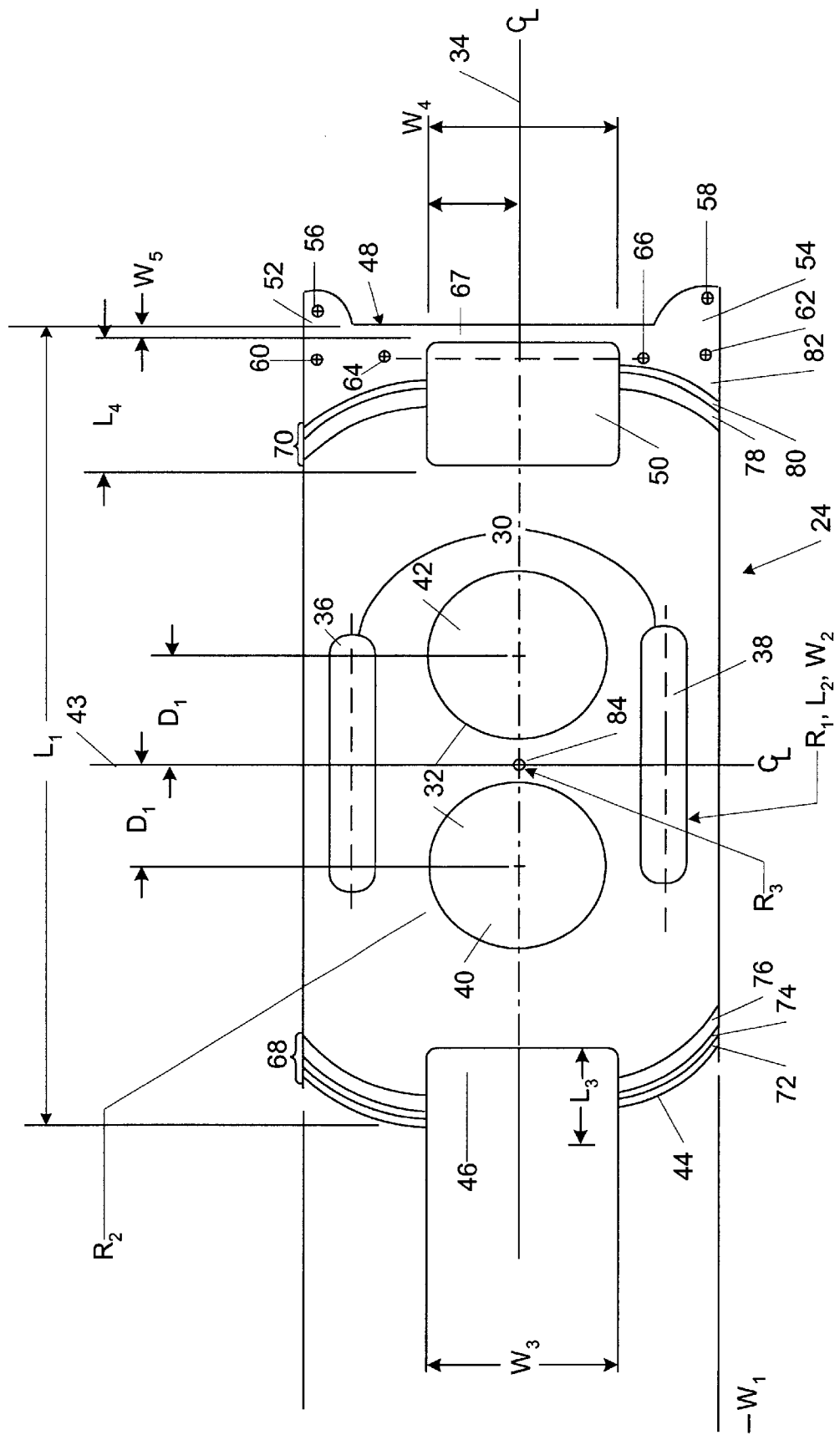
FIG. 3 is a top view of a blade for a mechanical wafer handling system.

As shown more clearly in FIGS. 2 and 3, blade 24 has a central region 28 with two arrays 30 and 32 of openings, with the openings arranged symmetrically in respect to each other. Wafer 16, while being supported by blade 24, would cover central region 28 and the edges of the wafer would overhang sides 29 and 31 of blade 24.

Referring to FIG. 3, blade 24 is a substantially planar member with several openings. Array 30 includes openings 36 and 38, which are elongated slots, located equidistantly from and on opposite sides of a central axis 34 extending along a length of blade 24. Array 32 includes openings 40 and 42, which are circular, located equidistantly from and on opposite sides of an axis 43 which is perpendicular to axis 34 and extending across a width of blade 24. Openings 36, 38, 40, and 42 are located and sized to reduce the thermal gradients which form across a hot wafer 16 when it is placed on a cold blade 24. If the wafer 16 is hot, e.g. over 550° C., the cold blade 24 acts as a heat sink and will create thermal gradients across the wafer 16. Peripheral parts of the wafer 16 which overhang blade 24 will not cool as fast as the parts of the wafer 16 directly above the blade 24. The resulting thermal gradients will induce stress in the wafer 16 and, if large enough, that stress can cause the wafer 16 to break. Even if the stresses are not large enough to cause the wafer 16 to break, they may nonetheless induce the formation of slip dislocations in the wafer's crystal structure, thereby destroying individual devices on the wafer 16 and reducing the wafer's potential yield of functional devices. To counteract the formation of thermal gradients, blade 24 has openings 36, 38, 40, and 42 specifically located and configured to reduce the heat loss at appropriate places on the hot wafer 16. The portions of the wafer 16 proximate to openings 36, 38, 40, and 42 tend to cool more slowly than the portions of the wafer 16 proximate to the material of blade 24. This is because the material of blade 24 proximate to the wafer 16 acts as a heat sink, and the elimination of blade material reduces the heat sink effect in those areas in which it was eliminated. The particular arrangement and size of holes 36, 38, 40, and 42 described herein was determined by using well-known thermal modeling tools and the objective was to significantly reduce thermal stresses without compromising the strength of the blade 24.

One end 44 of blade 24 has a notch 46. An opposing end 48 of blade 24 has an opening 50. Both notch 46 and opening 50 help reduce thermal gradients across a wafer 16 supported by blade 24 by reducing the thermal load of blade 24 on the wafer 16. The dimensions of notch 46 and opening 50 are chosen so as to reduce the mass of blade 24 while not compromising its strength for transferring wafers. Further, when placed in position for processing, wafer 16 rests on three lift pins (not shown). Notch 46 is shaped and located so as to provide clearance to one of these three pins. Blade 24 is inserted between the other two pins, so that the parts of wafer 16 overhanging blade 24 are positioned above the other two pins.

Blade 24 is secured to wrist 26 with screws (not shown) at end 48. End 48 has two wings 52 and 54 which are grasped by wrist 26. Each wing 52 and 54 has a screw hole 56 and 58 for receiving the screws which attach blade 24 to wrist 26. Two additional screw holes 60 and 62 for receiving additional screws to attach blade 24 to wrist 26 are located on blade 24 close to screw holes 56 and 58.

Pins 64 and 66 are located on blade 24 near screw holes 60 and 62. When blade 24 holds a wafer, pins 64 and 66 prevent the wafer from sliding out of position and accidentally touching wrist 26, which is made out of metal and might contaminate the wafer 16.

Blade 24 includes a narrow strip 67 which bridges wings 52 and 54. Narrow strip 67 forms one side of opening 50. The combination of narrow strip 67 and opening 50 provides stability to blade 24, while reducing the thermal load on the wafer 16.

Figure 4:
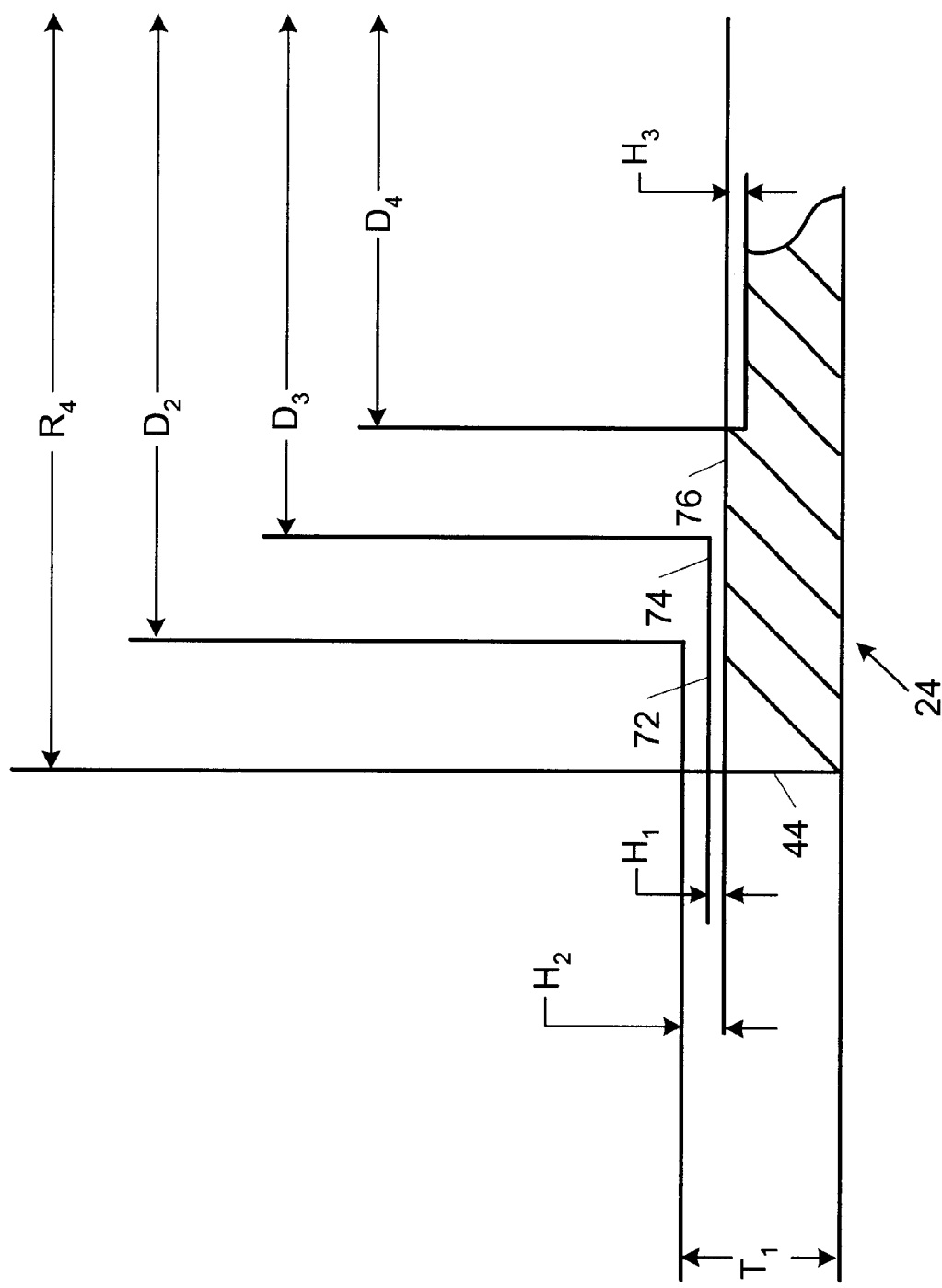
FIG. 4 is a cross-sectional view of an edge of the blade of FIG. 3.

Blade 24 has ledges 68 and 70 located on ends 44 and 48. Referring also to FIG. 4 which shows a cross-section of ledge 68, each ledge 68 and 70 includes three steps 72, 74, and 76, and 78, 80, and 82, respectively, following a contour of concentric circles. The wafer 16 rests on inner steps 76 and 78 during transport. Inner steps 76 and 78 reduce the wafer's contact with blade 24. Middle steps 74 and 80 keep the wafer 16 in place by providing a stop to the wafer's 16 potential lateral movement. Outer steps 72 and 82 are used as a visual guide for centering the wafer 16 on the blade 24 during initial manual calibration of robot system 21.

Opening 84 is located at an intersection of center axes 34 and 43 in central region 28 of blade 24. Opening 84 is used for calibrating the positioning of the wrist 26 and blade 24 assembly in cluster tool 10. More specifically, during the installation of cluster tool 10, blade 24 is fully extended without a wafer into process chamber 18. A rod (not shown) is lowered from the top of process chamber 18 and inserted through opening 84 to touch the bottom of process chamber 18. The location of the rod is checked for alignment with the center of the bottom of process chamber 18. If not properly aligned, the programming of robot system 21 is adjusted so as to accurately position the wafer 16 in process chamber 18, i.e. robot system 21 is set to extend the precise distance necessary to place the wafer 16 in a center of process chamber 18.

Blade 24 is made out of high purity quartz. Because it is made of the same elements as are typically found in the wafer 16 being processed, the possibility of contaminating the wafer 16 is reduced. Blade 24 is formed by machining with a laser in a laser milling machine.

Figure 5:
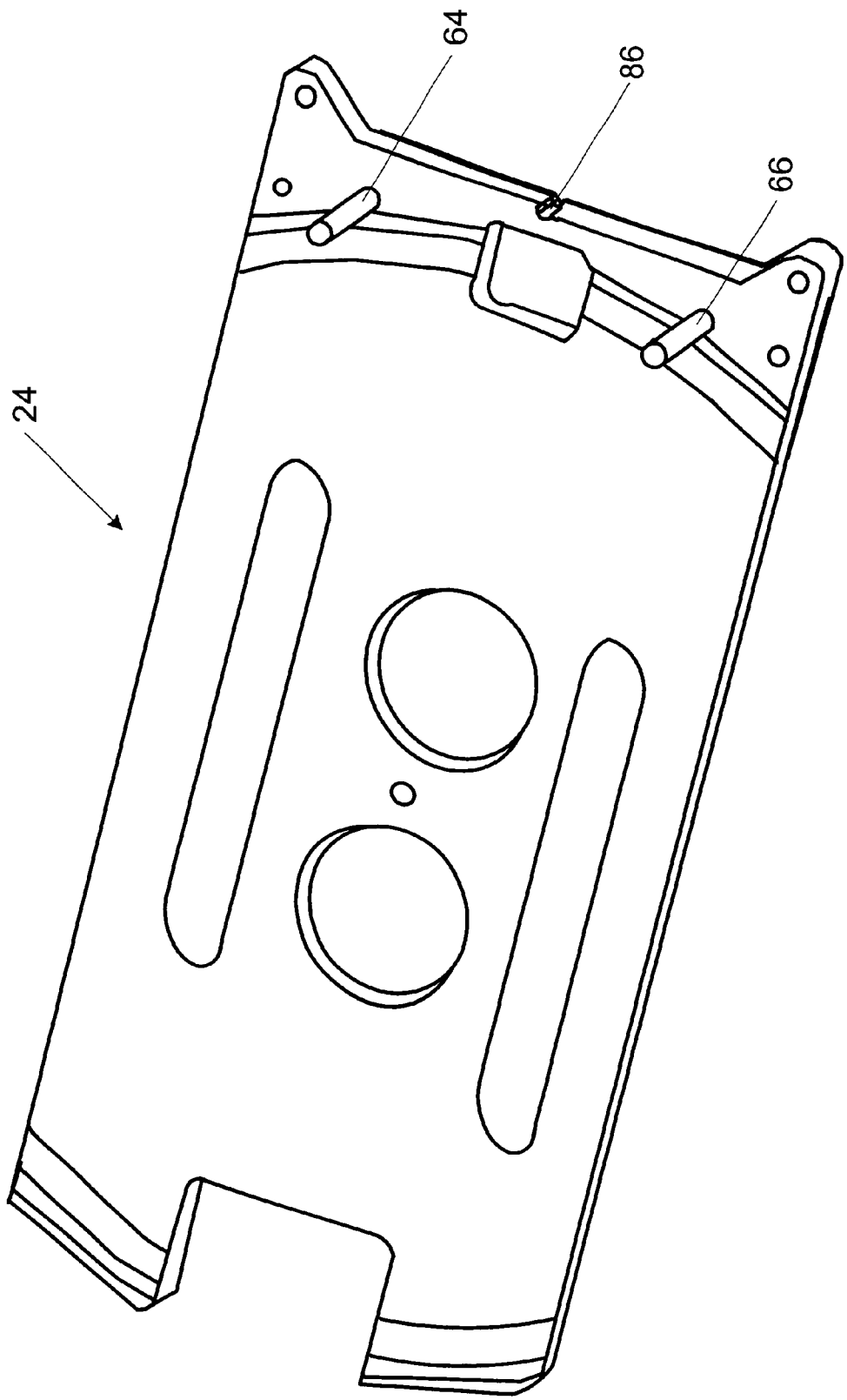
FIG. 5 is a perspective view of the blade of FIG. 3.

Referring to FIG. 5, pins 64 and 66 project upwardly from blade 24. Notch 86 is a centering slot which is an aid for assembling blade 24 and wrist 26.

Figure 10:
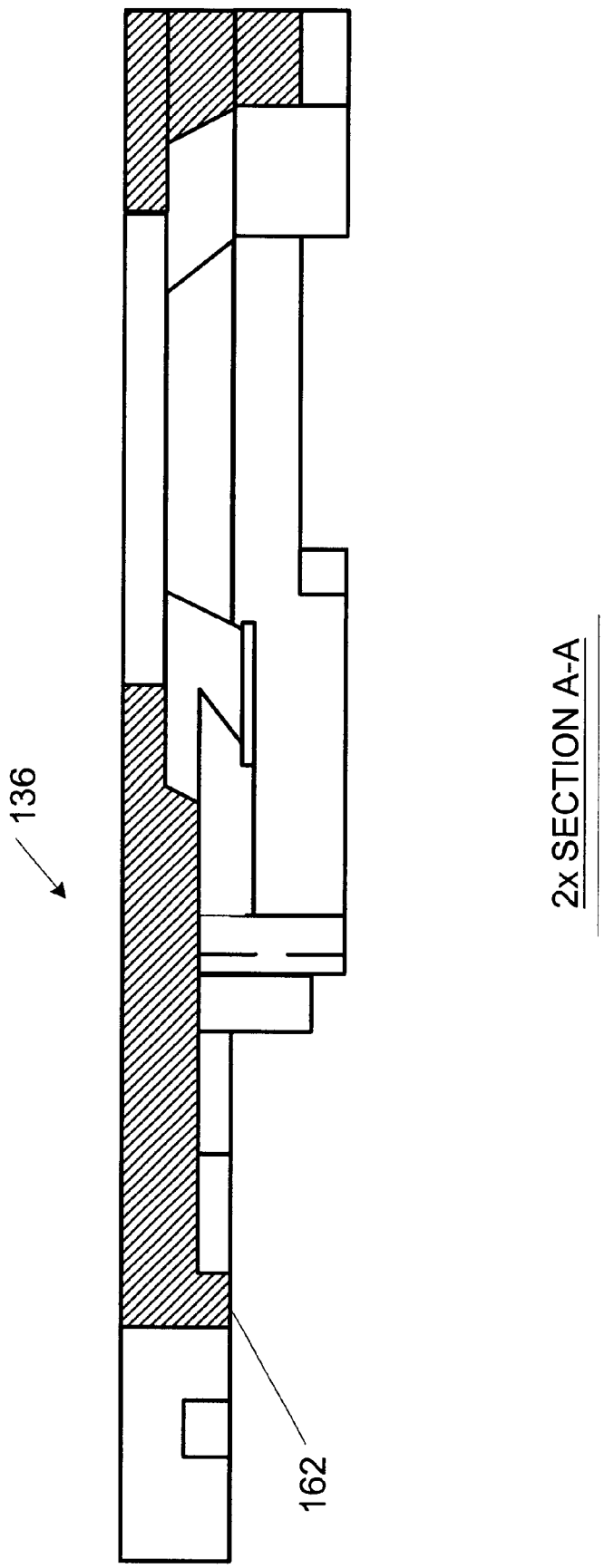
Figure 11:
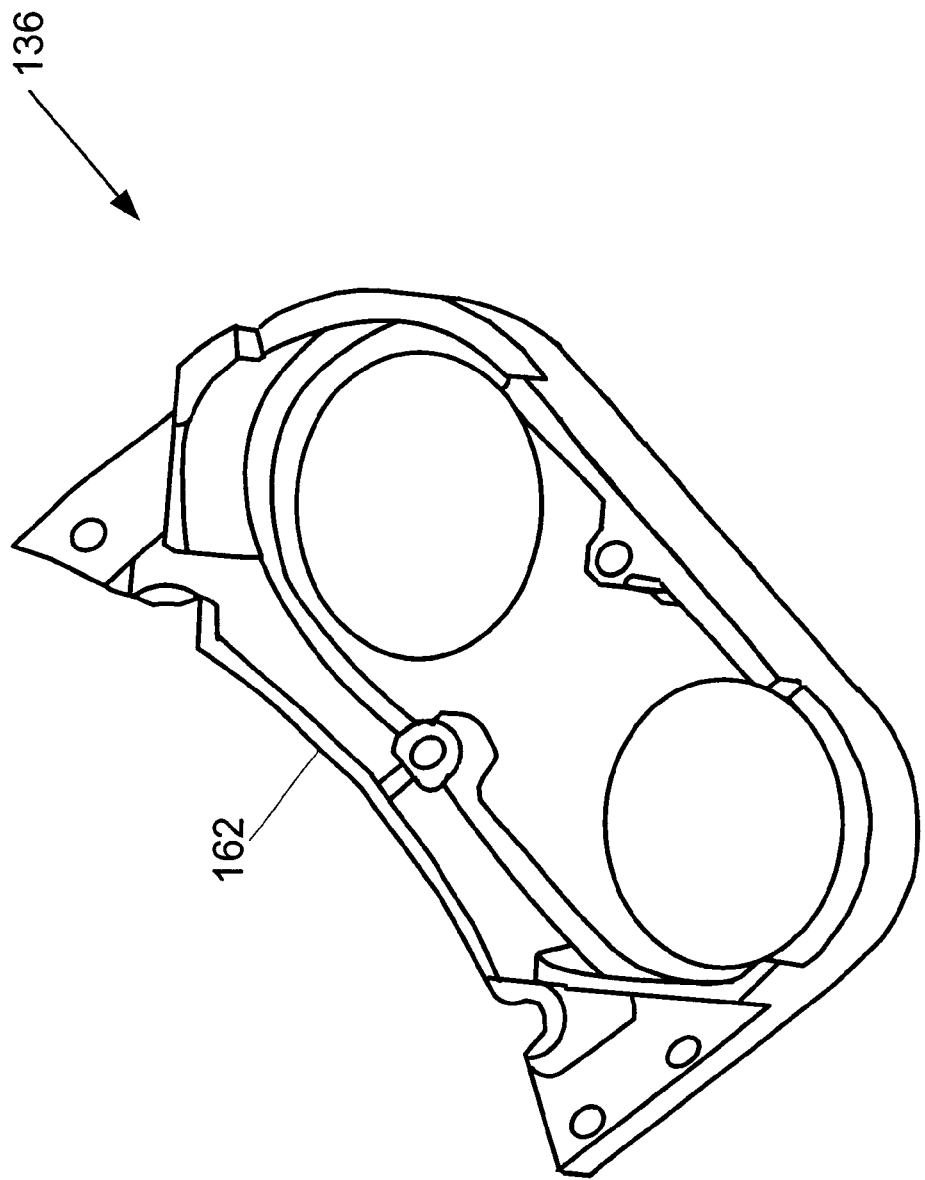
FIG. 11 is a perspective view of the wrist lower cap of FIG. 8.

Wrist 26 is made of a wrist upper cap 86 and a wrist lower cap 136. Referring to FIGS. 6, 6A, 7, and 8, wrist upper cap 86 is a roughly rectangular planar member with two curved corners 87 and 89 and one curved side 106. Wrist upper cap 86 has two columns 88 and 90 positioned on stepped bases 92 and 94, respectively, in a recessed center portion 96 of wrist upper cap 86. When robot system 21 is assembled, an appropriately shaped end of robot arm 22 engages with column 88 and a similarly shaped end of robot arm 23 engages with column 90. Recess 96 is defined by step 98 and rim 100. Located in rim 100 and immediately adjacent to recess 96 are two screw holes 102 and 104. Screws through these holes connect wrist upper cap 86 to wrist lower cap 136 (see FIGS. 9–11 for description of wrist lower cap 136).

Curved side 106 has two semi-circular indentations 108 and 110. When blade 24 is secured to wrist 26, pins 64 and 66 fit into indentations 110 and 108, respectively. A portion of edge 106, extending from and including indentations 108 and 110, has an upwardly rising ridge 111. When blade 24 is secured to wrist upper cap 86, ridge 111 serves to block particles from reaching blade 24, thus helping to prevent contamination of the wafer. Ridge 111 has a clearance of 0.002" to 0.004" from blade 24.

Adjacent to indentations 108 and 110 are two wings 112 and 114, respectively. Each wing 112 and 114 has a screw hole 116 and 118, respectively. Near screw holes 116 and 118, also located on rim 100, are two additional screw holes, 120 and 122. When blade 24 is secured to wrist 26, screw hole 116 in wrist upper cap 86 aligns with screw hole 62 on blade 24 and screw hole 118 in wrist upper cap 86 aligns with screw hole 60 on blade 24. Also, screw hole 120 in wrist upper cap 86 aligns with screw hole 58 in blade 24 and screw hole 122 in wrist upper cap 86 aligns with screw hole 56 in blade 24. Four screws (not shown) attach wrist upper cap 86 to blade 24 through these holes. The screws go through wrist upper cap 86 and blade 24, and screw into wrist lower cap 136.

Figure 7:
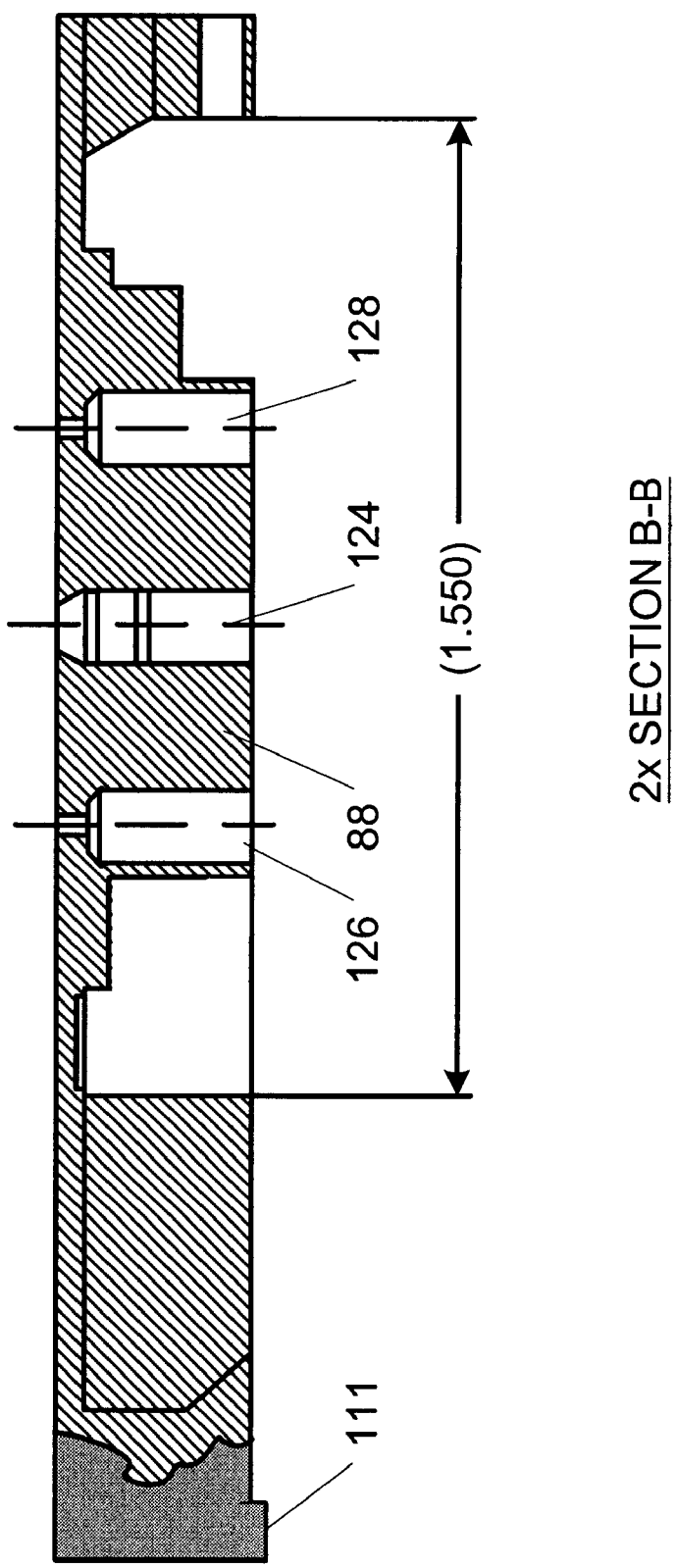
Figure 8:
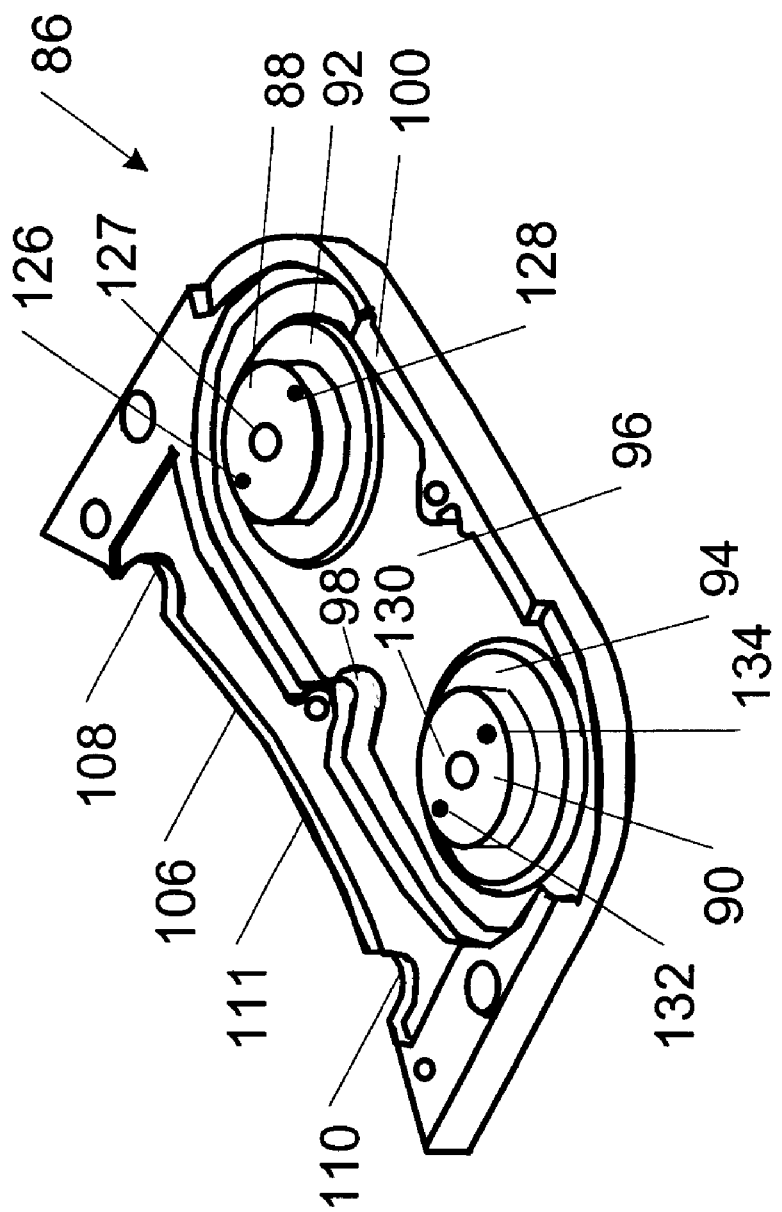
FIG. 8 is a perspective view of the wrist upper cap of FIG. 7.

Referring to FIG. 7 which shows a cross-section of wrist upper cap 86, cylinder 88 has a bore 124 at its center and two bores 126 and 128 near its outer perimeter. Bores 124, 126, and 128 are screw holes to be used for attaching rotation bearings (not shown). Rotation bearings are necessary for attaching the wrist 26 and blade 24 assembly to robot arms 22 and 23. Referring to FIG. 8, cylinder 90 has similarly located bores 130, 132, and 134.

Referring to FIGS. 9, 9A, 10, and 11, wrist lower cap 136 has the same general shape as wrist upper cap 86 with two curved corners 138 and 140 and one curved side 142. Wrist lower cap 136 also has two openings 144 and 146 in a recessed center portion 148. Recess 148 is defined by step 150 and rim 152. Located in rim 152 and immediately adjacent to recess 148 are two screw holes 154 and 156. Screws (not shown) through these holes 154 and 156 connect wrist lower cap 136 to wrist upper cap 86.

Wrist lower cap 136 has a curved edge 142. Edge 142 has two indentations 158 and 160. When blade 24 is secured to wrist 26, pins 64 and 66 fit into indentations 158 and 160. A portion of edge 142, extending from and including indentations 158 and 160, has a ridge 162. When blade 24 is secured to wrist lower cap 86, ridge 162 serves to block particles from reaching blade 24, thus helping to prevent contamination of the wafer 16.

Wrist lower cap 136 has two wings 164 and 166 adjacent to indentations 158 and 160, respectively. Each wing 164 and 166 has a screw hole 168 and 170, respectively. Near screw holes 168 and 170, also located on rim 152, are two additional screw holes, 172 and 174. When blade 24 is secured to wrist 26, screw hole 168 in lower wrist cap 136 aligns with screw hole 60 on blade 24 and screw hole 170 in wrist lower cap 136 aligns with screw hole 62 on blade 24. Also, screw hole 172 in wrist lower cap 136 aligns with screw hole 56 in blade 24 and screw hole 174 in wrist lower cap 136 aligns with screw hole 58 in blade 24. Thus, four screws (not shown) attach wrist lower cap 136 to blade 24.

Wrist upper cap 86 and wrist lower cap 136 are made out of nickel-plated anodized steel, a corrosion-resistant material.

When wrist 26 is assembled, cylinders 88 and 90 of wrist upper cap 86 fit into openings 144 and 146 of wrist lower cap 136. The wrist upper cap 86 and the wrist lower cap 136 contact the blade 24 only with the wing supports 112, 114, 164, and 166. Thus, contact with the blade 24 is minimized, thereby reducing the heat-sinking effect of the wrist 26.

In the illustrated embodiment, blade 24 is designed to transport 8-inch wafers. As indicated in FIG. 3, blade 24 has a width $W_1$ of 3.8 inches and a length $L_1$ of 8.42 inches. Openings 36 and 38 each have a length $L_2$ of 2.5 inches and a width $W_2$ of 0.5 inches, with rounded ends with a radius $R_1$ of 0.25 inches. Openings 40 and 42 are circles with a radius $R_2$ of 0.65 inches. A center of each opening 40 and 42 is a distance $D_1$ of 0.840 inches from center line 43. Notch 46 is a rectangular cut-out, with a length $L_3$ of 1.070 inches and a width $W_3$ of 1.500 inches. Opening 50 is rectangular, with a length $L_4$ of 1.080 inches and a width $W_4$ of 1.500 inches. Narrow strip 67 has a width $W_5$ of 0.170 inches. Center hole 84 has a radius $R_3$ of 0.063 inches.

As illustrated in FIG. 4, the outside edge of step 72 is formed at a radius $R_4$ of 4.15 inches. The inside edge of step 72 is a portion of a circle with a diameter $D_2$ of 8.118 inches. Step 72 has a height $H_1$ of 0.007±0.002 inches. The inside edge of step 74 is a portion of a circle with a diameter $D_3$ of 7.892 inches. Step 74 has a height $H_2$ of 0.014±0.002 inches. The inside edge of step 76 is a portion of a circle with a diameter $D_4$ of 7.40 inches. Step 76 has a height $H_3$ of 0.015±0.003 inches. Blade 24 at end 44 has a total thickness $T_1$ of 0.120 inches.

Figure 6A:
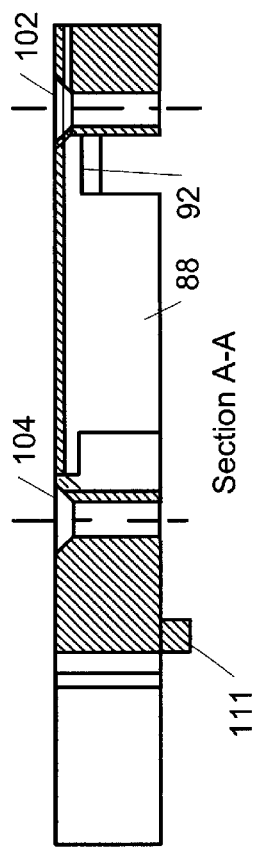
FIGS. 6A and 7 are cross-sectional views of the wrist upper cap of FIG. 6.
Figure 6:
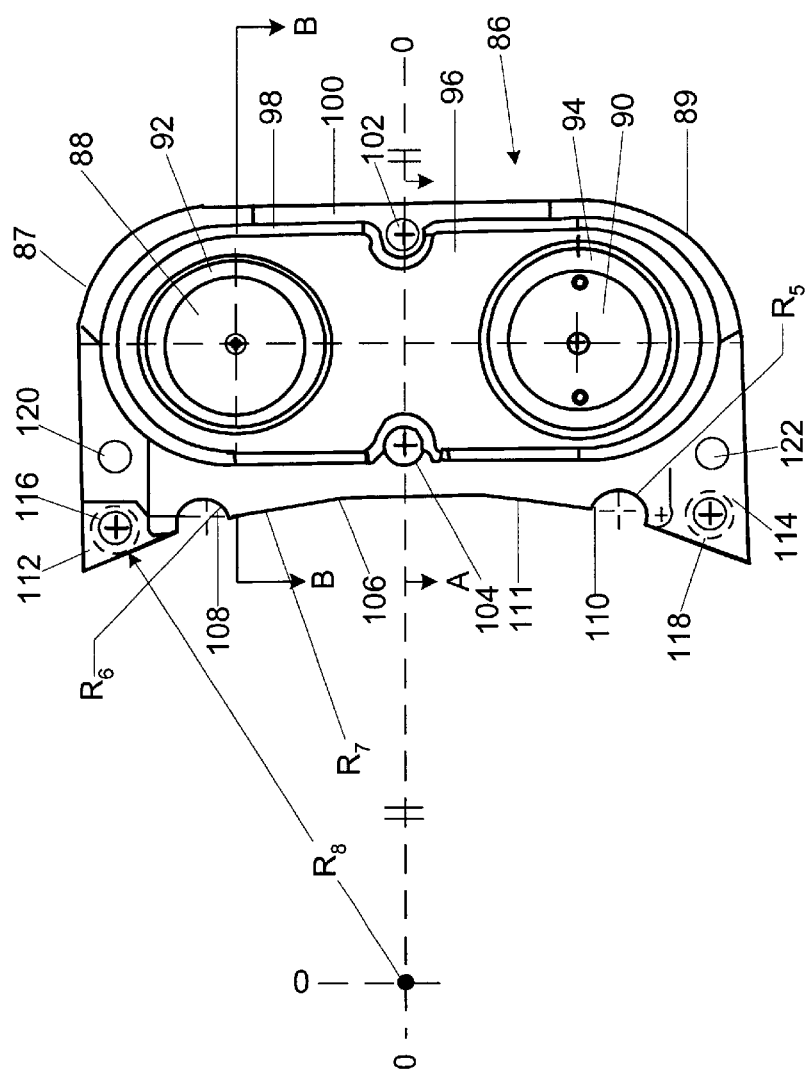
FIG. 6 is a top view of a wrist upper cap.

As shown in FIG. 6, wrist upper cap 86 has indentations 108 and 110 which have a ridge 111 with an outside radius $R_5$ of 0.160 inches and an inside radius $R_6$ of 0.140 inches. Curved side 106 has a ridge 111 with an outside radius $R_7$ of 4.130 inches and an inside radius $R_8$ of 4.110 inches.

As shown in FIG. 9, wrist lower cap 136 has indentations 158 and 160 which have a ridge 162 with an outside radius $R_9$ of 0.160 inches and an inside radius $R_{10}$ of 0.140 inches. Along curved side 142, ridge 162 has an outside radius $R_{11}$ of 4.130 inches and an inside radius $R_{12}$ of 4.110 inches. Ridge 162 has a height $H_4$ of 0.050 inches.

Although arrays 30 and 32 in FIG. 3 were described as each including two identical openings, one can also view the same arrangement of openings as being two arrays arranged symmetrically to each other on both sides of a central axis extending along the length of the blade. In the latter case, the first array would include opening 36 and the upper halves of openings 40 and 42, and the second array would include opening 38 and the lower halves of openings 40 and 42. In addition, embodiments could include various arrays of openings arranged substantially symmetrically on both sides of a central axis of a blade. The degree of symmetry required is such as is necessary to significantly reduce thermal gradients across the wafer to prevent breakage of the wafer or formation of dislocations due to thermal stresses.

Optimal configurations, sizes, and locations of these openings can be determined through the use of well-known thermal modelling techniques. The object of such thermal modelling is to size and locate arrays of openings so as to reduce thermal gradients across a wafer resting on a blade to the extent necessary to avoid damage-causing stresses. Such modelling typically takes into account the heat sinking effect of the material constituting the blade, the size of the wafer to be held, and the dimensions of the blade. In addition, consideration may be given to the effect of reflective surfaces above and below a wafer in the chamber in which the blade will be used. Because of the symmetry of the wafer and the general symmetry of the blade, the openings will generally be arranged substantially symmetrically over the blade. However, strict symmetry of the actual holes is not required although the thermal loading impact by the blade needs to be generally symmetrical to reduce thermal gradients sufficiently.

Other embodiments are within the following claims.

What is claimed is:

1. A blade for a mechanical wafer handling system, comprising an elongated planar member having a central region, wherein the central region has a first array of openings passing through the planar member and a second array of openings passing through the planar member, the openings of the first array being symmetrically arranged about and not touching a central longitudinal axis extending along the length of the planar member and passing through a center point of the central region and the openings of the second array of openings being symmetrically arranged about and touching the central longitudinal axis.

2. The blade of claim 1, wherein one short end of the elongated planar member has a notch.

3. The blade of claim 2, wherein the planar member has a peripheral opening positioned between the openings of the first and second arrays of openings and a second short end of the elongated planar member.

4. The blade of claim 2, wherein opposing short ends of the elongated planar member have ledges to support a wafer.

5. The blade of claim 1, wherein the elongated planar member is made out of quartz.

6. The blade of claim 1 wherein the first array of openings comprises two oval openings.

7. The blade of claim 1 wherein the second array of openings comprises two circular openings.

8. The blade of claim 1 wherein the openings in the first array are arranged substantially symmetrically with respect to a perpendicular axis extending along the width of the elongated planar member and passing through a center point of the central region perpendicular to the central longitudinal axis and wherein the openings in the second array are arranged substantially symmetrically with respect to said perpendicular axis.

9. The blade of claim 8 wherein the first array of openings comprises two oval openings and the second array of openings comprises two circular openings.

10. A blade for a mechanical wafer handling system, comprising;
an elongated planar member having a central region, wherein the central region has a first array of openings and a second array of openings, the openings of the first array being arranged substantially symmetrically to the openings of the second array on opposing sides of a central longitudinal axis extending along the length of the planar member and passing through a center point of the central region and
wherein the openings in the first array are arranged substantially symmetrically with respect to a perpendicular axis extending along the width of the elongated planar member and passing through a center point of the central region and wherein the openings in the second array are arranged substantially symmetrically with respect to said perpendicular axis, and wherein the first array of openings and the second array of openings comprise two circular openings and two oval openings.

11. A blade assembly for a mechanical wafer handling system, comprising:
an elongated planar member having a central region, wherein the central region has a first array of openings and a second array of openings, the openings of the first array being arranged substantially symmetrically to the openings of the second array on opposing sides of a central longitudinal axis extending along the lenght of the planar member and passing through a center point of the central region,
wherein the openings in the first array are arranged substantially symmetrically with respect to a perpendicular axis extending along the width of the elongated planar member and passing through a center point of the central region and wherein the openings in the second array are arranged substantially symmetrically with respect to said perpendicular axis;
a wrist upper cap having a first and a second wing support on two opposing sides of the upper cap and a first non-supporting narrow ridge extending between the first and second wing supports; and
a wrist lower cap having a third and a fourth wing support on two opposing sides of the lower cap with a second non-supporting narrow ridge extending between the third and the fourth wing supports,
wherein the wrist upper cap is attached to a top surface of the planar member and the wrist lower cap is attached to a bottom surface of the planar member when the blade assembly is assembled.

12. The blade assembly of claim 7, wherein the elongated planar member and the first, second, third, and fourth wing supports have screw holes and wherein the screw holes are arranged so that the screw holes in the planar member are aligned with the screw holes in the first, second, third, and fourth wing supports when the blade assembly is assembled.

13. The blade assembly of claim 7, wherein the first ridge and the second ridge are each less than ⅛" thick.

14. The blade assembly of claim 11, wherein the upper and the lower wrist caps are each made out of stainless steel.

15. The blade assembly of claim 14, wherein the upper and lower caps are each coated with anodized nickel.

16. A blade assembly for a mechanical wafer handling system, comprising:
an elongated planar member having a central region, wherein the central region has a first array of openings passing through the planar member and a second array of openings passing through the planar member, the openings of the first array being symmetrically arranged about and not touching a central longitudinal axis extending along the length of the planar member and passing through a center point of the central region and the openings of the second array of openings being symmetrically arranged about and touching the central longitudinal axis;
a wrist upper cap having a first and a second wing support on two opposing sides of the upper cap and a first non-supporting narrow ridge extending between the first and second wing supports; and
a wrist lower cap having a third and a fourth wing support on two opposing sides of the lower cap with a second non-supporting narrow ridge extending between the third and the fourth wing supports,
wherein the wrist upper cap is attached to a top surface of the planar member and the wrist lower cap is attached to a bottom surface of the planar member when the blade assembly is assembled.

17. The blade assembly of claim 16, wherein the elongated planar member and the first, second, third, and fourth wing supports have screw holes and wherein the screw holes are arranged so that the screw holes in the planar member and aligned with the screw holes in the first, second, third, and fourth wing supports when the blade assembly is assembled.

18. The blade assembly of claim 16, wherein the first ridge and the second ridge are each less than 1/8" thick.

19. The blade assembly of claim 16, wherein the upper and the lower wrist caps are each made out of stainless steel.

20. The blade assembly of claim 19, wherein the upper and lower caps are each coated with anodized nickel.

* * * * *